(12) United States Patent
Burckel et al.

(10) Patent No.: US 9,190,736 B1
(45) Date of Patent: Nov. 17, 2015

(54) FABRICATION OF SMALL-SCALE STRUCTURES WITH NON-PLANAR FEATURES

(75) Inventors: David B. Burckel, Albuquerque, NM (US); Gregory A. Ten Eyck, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 827 days.

(21) Appl. No.: 13/324,052

(22) Filed: Dec. 13, 2011

Related U.S. Application Data

(60) Provisional application No. 61/433,457, filed on Jan. 17, 2011.

(51) Int. Cl.
*H01Q 15/00* (2006.01)
*H01Q 7/00* (2006.01)

(52) U.S. Cl.
CPC ............. *H01Q 15/0086* (2013.01); *H01Q 7/00* (2013.01)

(58) Field of Classification Search
CPC ........ H01Q 15/0086; H01Q 5/22; H01Q 7/00
USPC .................................. 343/866, 700 MS, 742
See application file for complete search history.

(56) References Cited

U.S. PATENT DOCUMENTS

| | | | |
|---|---|---|---|
| 6,008,761 A * | 12/1999 | Harano | 343/866 |
| 6,204,815 B1 * | 3/2001 | Lesea et al. | 343/700 MS |
| 7,545,014 B2 * | 6/2009 | Wang et al. | 257/443 |
| 7,646,524 B2 * | 1/2010 | Tonucci | 359/244 |
| 8,197,887 B1 * | 6/2012 | Burckel | 427/97.7 |
| 8,237,102 B1 * | 8/2012 | Baehr-Jones et al. | 250/227.18 |
| 8,349,547 B1 * | 1/2013 | Burckel et al. | 430/322 |
| 8,440,089 B2 * | 5/2013 | Shimoyama et al. | 216/2 |
| 2002/0145489 A1 | 10/2002 | Cornett et al. | |
| 2002/0166218 A1 | 11/2002 | Barber | |
| 2004/0008942 A1 * | 1/2004 | Scheuer et al. | 385/39 |
| 2006/0138429 A1 | 6/2006 | Heo | |
| 2007/0097003 A1 * | 5/2007 | Sasaki et al. | 343/742 |
| 2009/0009853 A1 * | 1/2009 | Tonucci | 359/298 |
| 2010/0245790 A1 * | 9/2010 | Seltmann et al. | 355/30 |

OTHER PUBLICATIONS

Bharadwaj, Palash, Bradley Deutsch and Lukas Novotny, Optical Antennas, Advances in Optics and Photonics 1, pp. 438-483, Aug. 11, 2009.*

Burckel, D. Bruce et al.; *Fabrication of 3D Metamaterial Resonators Using Self-Aligned Membrane Projection Lithography*; Sandia National Laboratories, Albuquerque, NM; Wiley InterScience, Advanced Materials Jun. 8, 2010, 22, pp. 3171-3175 (first received Dec. 3, 2009).

(Continued)

*Primary Examiner* — Dameon E Levi
*Assistant Examiner* — Jennifer F Hu
(74) *Attorney, Agent, or Firm* — Martin I. Finston

(57) ABSTRACT

The fabrication of small-scale structures is disclosed. A unit-cell of a small-scale structure with non-planar features is fabricated by forming a membrane on a suitable material. A pattern is formed in the membrane and a portion of the substrate underneath the membrane is removed to form a cavity. Resonators are then directionally deposited on the wall or sides of the cavity. The cavity may be rotated during deposition to form closed-loop resonators. The resonators may be non-planar. The unit-cells can be formed in a layer that includes an array of unit-cells.

5 Claims, 13 Drawing Sheets

(56) References Cited

OTHER PUBLICATIONS

Burckel, D. Bruce et al.; *Micrometer-Scale Cubic Unit Cell 3D Metamaterial Layers*; Sandia National Laboratories, Albuquerque, NM; Wiley InterScience, Advanced Materials Dec. 13, 2010, 22, pp. 5053-5057 (first received Jul. 6, 2010).

Burckel, D. Bruce et al.; *Dynamic Membrane Projection Lithography*; Sandia National Laboratories, Albuquerque, NM; 2011 Optical Society of America (7 pages).

Knight, Mark W. et al.; *Photodetection with Active Optical Antennas*, Science vol. 332, pp. 702-704, May 6, 2011 (first received Jan. 19, 2011).

Liu, Jingquan et al.; *Fabrication of Hollow Metal "Nanocaps" and Their Red-Shifted Optical Absorption Spectra*, Advanced Materials 2005, 17, pp. 1276-1281, (first received Jan. 7, 2005).

Mirin, Nikolay et al.; *Light Bending Nanoparticles*; Nano Letters 2009, vol. 9, No. 3, ASC Publications, Feb. 19, 2009 pp. 1255-1259 (first received Jan. 20, 2009).

Bryant, Garnett W., et al.; *Mapping the Plasmon Resonances of Metallic Nanoantennas*; Nano Letters 2008, vol. 8, No. 2, pp. 631-636; American Chemical Society Jan. 12, 2008 (first received Nov. 21, 2007).

Takano, Nao et al.; *Fabrication of metallic patterns by microstencil lithography on polymer surfaces suitable as micro electrodes in integrated microfluidic systems*; Journal of Micromechanics and Microengineering, IOP Publishing Ltd, Jul. 3, 2006 pp. 1606-1613, (first received Mar. 30, 2006).

Gross, L., et al.; *Fabrication of ultrathin magnetic structures by nanostencil lithography in dynamic mode*; Applied Physics Letters 90, Mar. 1, 2007 American Institute of Physics, 3 pages, (first received Dec. 15, 2006).

Aksu, Serap, et al.; *High-Throughput Nanofabrication of Infrared Plasmonic Nanoantenna Arrays for Vibrational Nanospectroscopy*; Nano Letters, American Chemical Society Jun. 18, 2012, pp. 2511-2518 (first received Mar. 24, 2010).

Hirose, Kenichiro, et al.; *A simultaneous vertical and horizontal self-patterning method for deep three-dimensional microstructures*; Journal of Micromechanics and Microengineering, IOP Publishing Ltd Jun. 26, 2007, pp. S68-S76, (first received Dec. 29, 2006).

Kim, Gyuman, et al.; *All-photoplastic microstencil with self-alignment for multiple layer shadow-mask patterning*; Elsevier B.V. June 4, 2003, www.sciencedirect.com Sensors and Actuators A 107 (2003) pp. 132-136 (first received Jun. 12, 2001).

Akasaka, Y., "Three-Dimensional IC Trends", Proceedings of the IEEE, Dec. 1986, vol. 74, No. 12, pp. 1703-1714.

Ishihara, et al., "Monolithic 3D-ICs with single grain Si thin film transistors", Solid-State Electronics, 2012, pp. 80-87.

Lai, et al., "Wafer-level three-dimensional integrated circuits (3D IC): Schemes and key technologies", Microelectronic Engineering 2011, vol. 88, pp. 3282-3286.

Matthias, et al., "Paradigm changes in 3D-IC manufacturing", Solid State Technology—3D Integration, Jul. 2013, pp. 29-40.

Moers, J., "Turning the world vertical: MOSFETs with current flow perpendicular to the wafer surface", Applied Physics A Materials Science and Processing, 2007, vol. 87, pp. 531-537.

\* cited by examiner

FABRICATION OF SMALL-SCALE STRUCTURES WITH NON-PLANAR FEATURES

CROSS-REFERENCE TO RELATED APPLICATIONS

This application claims the benefit of U.S. Provisional Application Ser. No. 61/433,457 entitled METHOD FOR CREATION OF 3-D NANO-ANTENNAS and filed on Jan. 17, 2011, which application is incorporated by reference in its entirety.

STATEMENT REGARDING FEDERALLY SPONSORED RESEARCH OR DEVELOPMENT

This invention was made with government support under Prime Contract Number DE-AC04-94AL85000 awarded by U.S. Department of Energy The government has certain rights in the invention.

BACKGROUND

Electromagnetic signals exist across a large range of wavelengths. Electromagnetic signals include, for example, radio waves, visible light, X-rays, microwaves, infrared and ultraviolet waves. Electromagnetic signals can be used for a large variety of purposes in part because the various wavelengths of electromagnetic radiation interact with different materials in different ways. In fact, many materials (e.g., semiconductor lasers, Bragg reflectors, optical films, antennas) are designed to interact with electromagnetic waves in certain ways to produce certain results.

Metamaterials constitute another class of materials that are designed to interact with electromagnetic waves in specific ways. Metamaterials, in fact, can be configured to interact with electromagnetic signals in ways that other materials do not. Metamaterials may exhibit properties that may not ordinarily be present in other materials. For instance, metamaterials may exhibit a negative refractive index. This property, among others, opens up a new area of research and development.

Small-scale antennas is another class of materials that are designed to interact with electromagnetic waves in specific ways. Generally, an antenna is a device that transmits and/or receives electromagnetic waves. To operate efficiently, the antenna often has a size that is related to the wavelength of the signal being received/transmitted. Usually, the dimensions of the antenna are smaller than the wavelength of interest. It becomes increasingly difficult to construct antennas that are suitable for wavelengths that have small wavelengths.

The manufacture of small-scale structures such as metamaterials and nano-antennas, particularly with regard to shorter wavelengths, faces several challenges. For some purposes, metamaterials are limited in the sense that they can only operate effectively with larger wavelengths. In other words, the size of the metamaterial may impact which wavelengths can be used beneficially. As wavelengths become shorter, it becomes increasingly difficult to construct small-scale structures with resonators that are sufficiently small.

In addition, the fabrication of metamaterials is impacted by conventional lithography techniques, which are limited to planar patterns. Immersion lithography, nano-imprint lithography, and e-beam lithography, for example, are capable of printing small features. However, these lithography techniques are also planar in nature and are limited with respect to three-dimensional structures.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Additional features and advantages of embodiments of the invention will be set forth in the description which follows, and in part will be obvious from the description, or may be learned by the practice of the embodiments of the invention. The features and advantages of the embodiments of the invention may be realized and obtained by means of the instruments and combinations particularly pointed out in the appended claims. These and other features of the embodiments of the invention will become more fully apparent from the following description and appended claims, or may be learned by the practice of the invention as set forth hereinafter.

In one or more embodiments, a method for fabricating a structure is provided. The structure may be a small-scale structure having dimensions on the order of micrometers or smaller. To fabricate the structure, a membrane is formed on a substrate. The membrane and the substrate may be formed of different materials and may have properties that allow one of the materials to be etched without affecting the other material. A pattern is then formed in the membrane. This exposes the substrate at the pattern and allows a cavity to be formed underneath the membrane using a suitable technique such as etching. After the cavity is formed, the cavity or substrate is rotated while depositing the resonators. The pattern in the membrane provides a guide for the directional evaporation while rotating the such that the resonators are deposited according to a predetermined path. The path is determined by the orientation of the substrate relative to the evaporative deposition.

When the substrate or a source of the evaporative deposition is rotated during deposition, different resonators including closed loop resonators may be deposited on the surface of the cavity. When rotation is used, the shape of the resonator may depend on the angle of deposition and whether or not the deposition is shuttered (e.g., interrupted to form an open loop resonator).

After the resonators are deposited, the membrane is removed. The resulting small-scale structure may be back-filled with another material if desired.

The small-scale structure is typically formed in a substrate such that multiple unit-cells are formed. More generally, multiple patterns are formed in the membrane and each pattern (or group of patterns) typically corresponds to a unit-cell. Each unit-cell can be formed to include resonators including non-planar resonators. After an initial layer is formed, additional layers can be formed or grown on the previously formed layer. This enables the fabrication of a small-scale structure that has 3D elements (e.g., non-planar resonators) at both a unit-cell level and from a completed structure perspective.

BRIEF DESCRIPTION OF THE DRAWINGS

In order to describe the manner in which the above-recited and other advantages and features of the embodiments of the invention can be obtained, a more particular description of the embodiments of the invention briefly described above will be rendered by reference to the appended drawings. Understanding that these drawings depict only typical embodiments of the invention and are not therefore to be considered to be limiting of its scope, the embodiments of the invention will be described and explained with additional specificity and detail through the use of the accompanying drawings in which.

DETAILED DESCRIPTION OF EMBODIMENTS OF THE INVENTION

Figure 1:
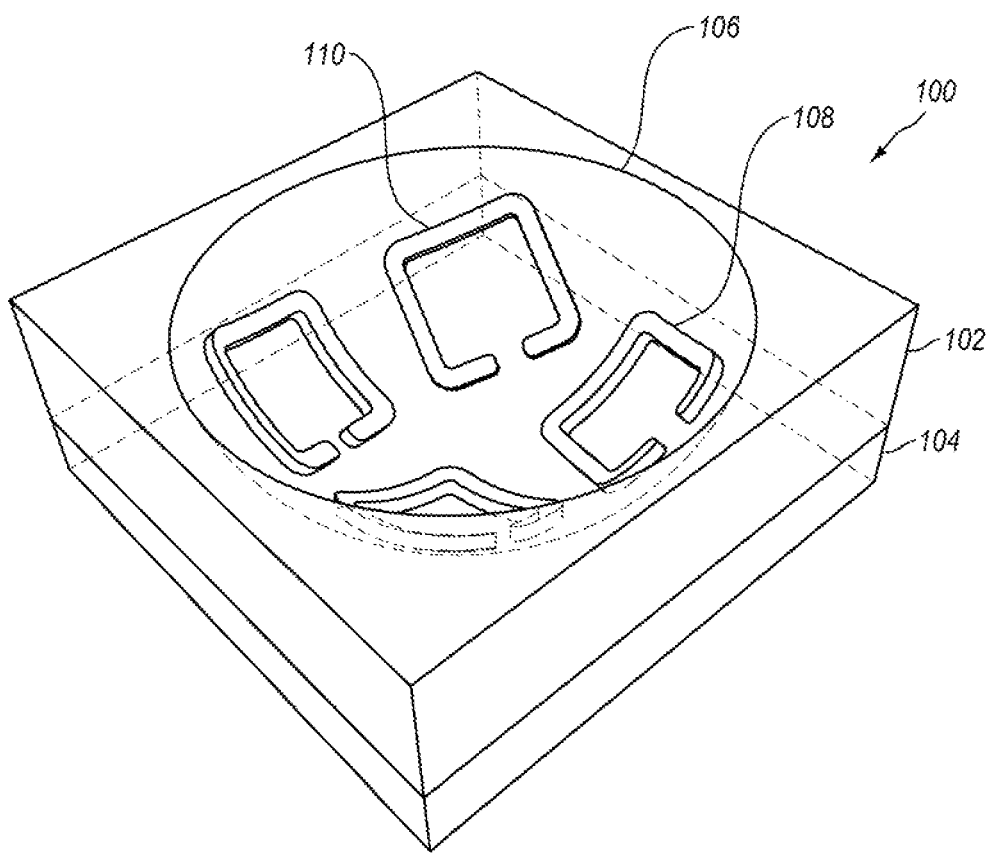
FIG. 1 is a perspective view of a unit-cell of a structure in accordance with at least some embodiments.

Embodiments of the disclosure relate to structures including small scale structures and the fabrication thereof. Embodiments of the disclosure further relate to structures including, but not limited to, small scale three-dimensional (3D) nano-antennas, metamaterials and to methods for fabricating these structures. Embodiments of the disclosure further relate to the fabrication of small scale structures using membrane projection lithography (MPL). MPL includes depositing materials using evaporation, including directional evaporation. Embodiments disclosed herein also selectively rotate and/or position the small scale structures during fabrication. Rotation and/or reorientation of the small-scale structures (and/or of the evaporative source) during fabrication MPL enables materials to be deposited in a wide range of locations and configurations.

Embodiments of the invention may be discussed in the context of metamaterials and 3D nano-antennas. One of skill in the art, however, can appreciate that the structures and methods of fabrication disclosed herein are not limited to metamaterials and 3D nano-antennas but also encompass, by way of example and not limitation, micro-lens arrays, photonic structures, or the like or combinations thereof. Embodiments enable the fabrication of micrometer, nanometer (or smaller) structures that may include out-of-plane or non-planar components including non-planar resonators.

The structures disclosed herein may include multiple numbers of a basic unit, referred to herein as a unit-cell. An array of unit-cells, for example, may be formed in a given substrate. A unit-cell may also be formed to include 3D aspects or components that can be formed in accordance with the methods disclosed herein to include non-planar characteristics including non-planar resonators. As discussed in more detail herein, the small-scale of the structures enables use with smaller wavelengths. As a result, embodiments of the invention enable optical signals to be received and converted into electrical signals via a 3D nanoantenna. Similarly, an electrical signal can be radiated at optical wavelengths.

The unit-cells in an array can each be identically configured or substantially the same with allowance given for the manufacturing process. In other embodiments, some of the unit-cells may be configured differently than other unit-cells. The arrays can be repeated in a layer-by-layer fashion to fabricate engineered volumetric materials.

Embodiments of the invention can also be formed on-chip along with other circuitry. This may enable antenna structures to be embedded on-chip to enable intra-chip communication or inter-chip communication that is optical in nature due to the small-scale size of the antenna structure.

The individual unit-cells can be configured with cavities and/or resonators that can leverage symmetry, geometry, and/or material. The symmetry, geometry, and/or material of the resonators, cavity and/or the substrate in which the cavity is formed can also contribute to multi-dimensional current flow within not only the same unit-cell but also with respect to adjacent unit-cells in the same array or in other layers of the structure.

In addition, the structures disclosed herein can be fabricated with sufficient miniaturization to accommodate shorter wavelengths. As a result, the structures disclosed herein can interact with wavelengths on the order of at least micrometers and nanometers. By way of example and not limitation, molecular vibrational modes of interest for chemical sensing occur from 1-15 micrometers. Thermal radiation at 300K (room temperature) is peaked over the spectral range from 8-12 micrometers. Hotter objects have shorter wavelength peaked emission. Infrared imaging optics frequently target either the 3-5 micrometer or 8-12 micrometer spectral range. Antennas designed for telecommuncations applications need to interact with 1.3 micrometer and 1.55 micrometer wavelengths. Visible wavelengths span 400-700 nanometers.

Generally, MPL is effective to create 3D volumetric materials. As discussed in more detail herein, the fabrication of a structure involves the formation of a patterned membrane over a cavity in a substrate. Directional evaporation is then used to deposit instances of the membrane pattern on the interior wall or face of the cavity. During fabrication, rotation of the structure and/or of the evaporative source may be performed. The resulting unit-cell may then have engineered characteristics to operate, as previously discussed, as a small antenna (e.g., on a micro-level or smaller), lens arrays, metamaterials, or the like.

FIG. 1 illustrates a perspective view of a unit-cell 100 in accordance with at least some embodiments disclosed herein. The unit-cell 100 may be fabricated in conjunction with an array of unit-cells in a substrate. The unit-cells in an array are typically fabricated at the same time from the same substrate. The process of creating the array can be repeated to fabricate layers of arrays of unit-cells. The unit-cell 100 can be fabricated in arrays of unit-cells and the arrays can be combined to form multi-layered multi-dimensional structures such as metamaterials and 3D nano-antennas.

FIG. 1 illustrates a unit-cell 100 of a three-dimensional structure that may include two and/or three dimensional resonators. Stated another way, the unit-cell 100 may include planar and/or non-planar resonators. The unit-cell 100 is typically formed in a substrate 102, which may be optionally formed on at least one other substrate 104.

To fabricate the unit-cell 100, a cavity 106 is formed in the substrate 102. The cavity 106 can be formed to have a particular shape. The cavity 106, by way of example, may be spherical (or hemispherical), cylindrical, rectangular, ellipsoidal, clover-shaped, pyramidal, or the like or any combination thereof. As described in more detail herein, the shape of the cavity 106 may depend on the composition of the substrate 106 (which may include more than one material) as well as the technique used to form the cavity 106 in the substrate 102.

After the cavity is formed, resonators 108 and 110 are deposited on a wall or on the sides of the cavity 106 of the unit-cell 100. Because the cavity 106 can be non-planar (e.g., hemispherical or other shape), the resonators 108 and 110 can be placed such that they exist or project in multiple dimensions and are therefore non-planar. Thus, each unit-cell 100 in an array can include non-planar resonators. The resonators 108 and 110 conform to the shape of the wall of the cavity 106 on which they are deposited. In the illustrated embodiment, the resonators 108 and 110 are depicted as so-called split-ring resonators (SRRs). However, other types of resonators including closed-loop resonators may be formed depending upon the particular application.

In the case of a hemispherical cavity, for instance, the resonators 108 and/or 110 may have curves or bends that conform to the hemispherical wall. The shape of the resonators 108 and 110 may depend on both the shape of the cavity 106 and the location in the cavity 106 on which the resonators 108 and 110 are formed. Each resonator 108 and 110 may be individually non-planar. Alternatively, all of the resonators may be collectively viewed as non-planar.

In FIG. 1 for example, the resonator 108 is formed or deposited on a wall of the cavity 106. Because the cavity 106 is spherical in this example, the resonator 108 is curved (according to the radius of curvature of the cavity 106) to follow the shape of the wall of the cavity 106.

If the cavity formed in the substrate 102 were rectangular, then the shape of the resonator 108 may depend on where the resonator 108 is deposited, within the cavity. Depositing the resonator 108 on a side of the rectangular cavity may result in a planar or substantially planar resonator. Depositing the resonator 108 in the corner, however, may result in the resonator 108 being located in multiple planes. The resonators can be formed to have various geometries in accordance with at least some examples disclosed herein.

Figure 2:
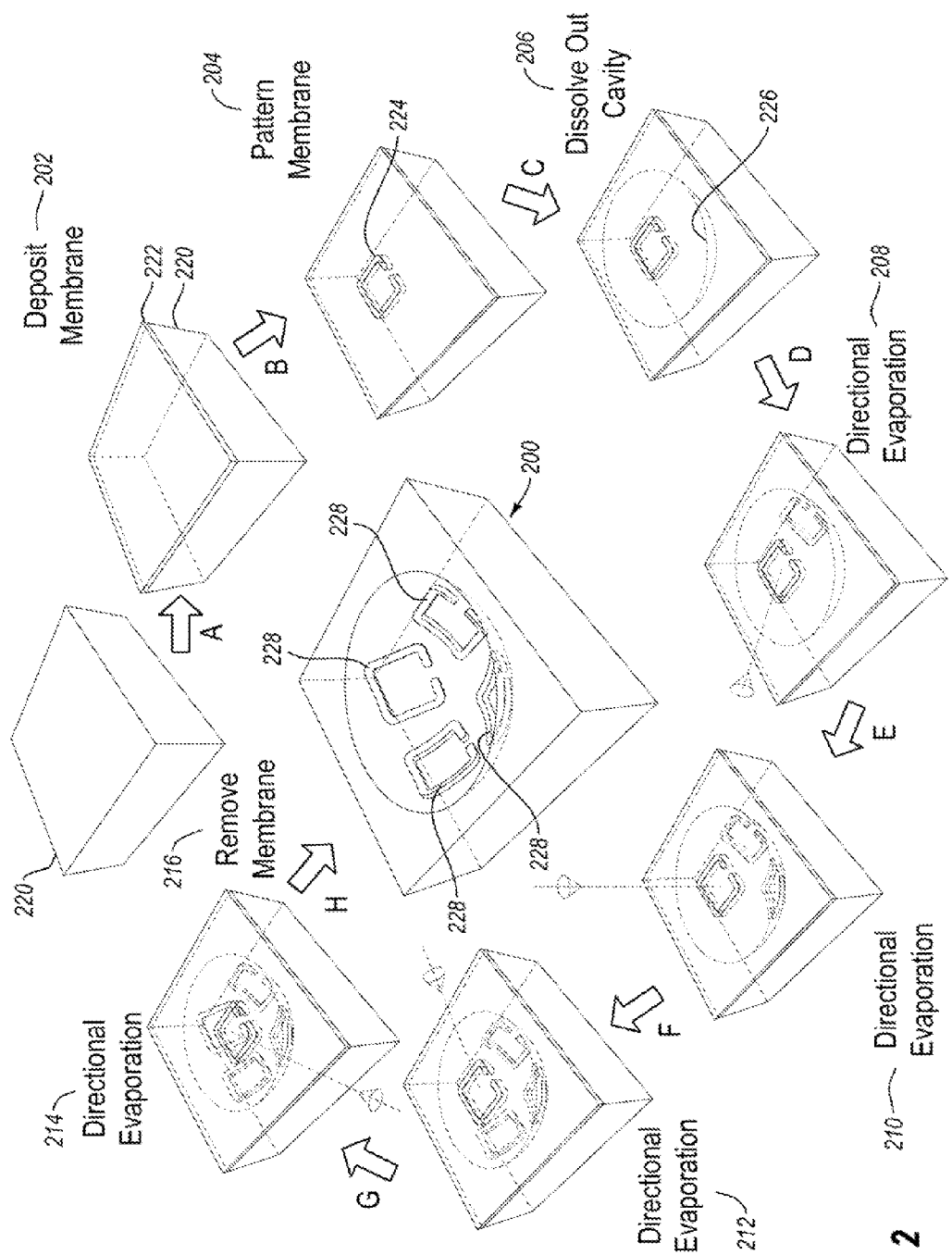
FIG. 2 illustrates an example method for fabricating a three-dimensional structure in accordance with at least some embodiments.

FIG. 2 illustrates an example method for fabricating a structure such as a small-scale structure. More specifically, FIG. 2 illustrates an example of a method for fabricating a unit-cell 200, which is another example of the unit-cell 100 shown in FIG. 1. The dimensions of the unit-cell 100 may be on the order of micrometers and/or nanometers. For example, a diameter of a hemispherical cavity may be between 1 and 10 micrometers. By way of example only and not limitation, a width of the resonators may be around 1-20 nanometers. Embodiments are not limited to these ranges, but may be formed to have larger or smaller dimensions.

FIG. 2 further illustrates the fabrication of the unit-cell 200 of a metamaterial or a 3D nano-antenna for illustration. Although the fabrication of a single unit-cell is illustrated, the process can be applied to all or some of the unit-cells in an array of unit-cells at the same time. The method shown in FIG. 2 for fabricating the unit-cell 200 begins with a substrate 220, which is an example of the substrate 102. Once the substrate 220 has been obtained or prepared, a membrane 222 is deposited on the substrate 220 in step 202 (Deposit Membrane).

In step 204 (Pattern Membrane), a pattern 224 is formed in the membrane 222. The pattern 224 can be formed, for example, using photoresist and conventional lithography techniques. When forming the pattern 224, the substrate 220 is exposed at the location of the pattern 224. The pattern 224 is selected according to a desired shape and/or configuration of the resonators to be formed in the unit-cell 200.

In step 206, a cavity 226 is formed. In one example, the cavity is formed by dissolving the substrate 220 which is under the pattern 224 and exposed by the pattern 224. In one example, the substrate 220 may be a polyimide, which is also developable during the photoresist process of forming the pattern 224. By adjusting the imidization temperature, a rate of dissolution for the substrate 220 (e.g., polyimide) can be adjusted to be faster than or slower than the development rate of the photoresist. For example, trimethyl ammonium hydroxide (TMAH) is one suitable chemical composition suitable for dissolving the polymide substrate 220 under the pattern 224. If the dissolution rate is sufficiently high, the cavity 226 can be formed. In one example, an isotropic hemispherical cavity is etched under the membrane 222. The shape of the cavity 226 may be independent of a geometry of the pattern 224 in the membrane 222.

In addition, the process of forming the cavity 226 can be conducted using more than one type of dissolution. A hemispherical cavity is typically formed using an isotropic etch. The isotropic etch, however, can be combined with an anisotropic etch to impact the formation of the cavity. For instance, if an anisotropic etch is used first, then the cavity depth can be decoupled from the cavity width. This may be used to increase a density of unit-cells in a substrate.

Once the cavity 226 is formed, the resonators are formed by directional evaporation through the pattern 224 in the membrane 222. Steps 208, 210, 212, and 214 (Directional Evaporation) each illustrate directional evaporation of a material. The directional evaporation deposits material (e.g., a suitable metal or alloy or dielectric) on the sides or wall of the cavity 226 to form the resonators. In this example, four distinct evaporation steps results in four distinct resonators on the wall of the cavity 226 as illustrated by the unit-cell 200 in FIG. 2.

During the directional evaporation deposition steps, the material is directionally deposited through the membrane 222. The pattern 224 operates as a guide such that the directionally evaporated material is deposited on the wall of the cavity 226 in a shape that is substantially the same as the shape of the pattern 224. Because the membrane 222 has a thickness, the dimensions of the resonators may vary slightly from the dimensions of the pattern 224 due to the angle of the directional evaporation. In addition, the thickness of the membrane 222 may impact the angle of evaporation deposition. The differences may also depend on the angle at which the material is deposited via the membrane. In one example, the angle of deposition is selected such that all sides of the resonators have substantially the same width.

In step 216 (Remove Membrane), the membrane 222 is removed, leaving the unit-cell 200 or, more generally, an array of unit-cells that have resonators formed therein. For example, the membrane 222 may be removed using a suitable solvent or other selective removal technique.

The unit-cells in the array are also self-aligned in some examples. Because the cavities in the unit-cells are formed after the membrane is formed on the substrate and patterned, the etching is automatically centered underneath the patterns in the membrane. In at least this sense, the unit-cells are self-aligned in the substrate.

The method shown in FIG. 2 results in a self-aligned metamaterial that can be formed using membrane projection lithography. The resulting resonators may be non-planar and can be formed in arbitrary patterns. The pattern 224, for example, can be determined beforehand and the shape of the pattern 224 can be arbitrary. The pattern 224 typically results in open ended resonators. A closed loop resonator is difficult to form since the membrane inside the closed loop has no support once the cavity is formed. As discussed in more detail below, closed loop resonators can be formed by rotating the substrate with respect to the evaporative deposition.

In addition, various aspects of the unit-cell 200, and other structures disclosed herein, are scalable. For example, a thickness of the resonators 228 can be controlled by controlling a time and/or material concentration during steps 208, 210, 212, and 214. The size and depth of the cavity 226 can similarly be controlled by controlling the imidization temperature and/or the rate of dissolution of the substrate 220 and/or the composition of the substrate 220.

Figure 3:
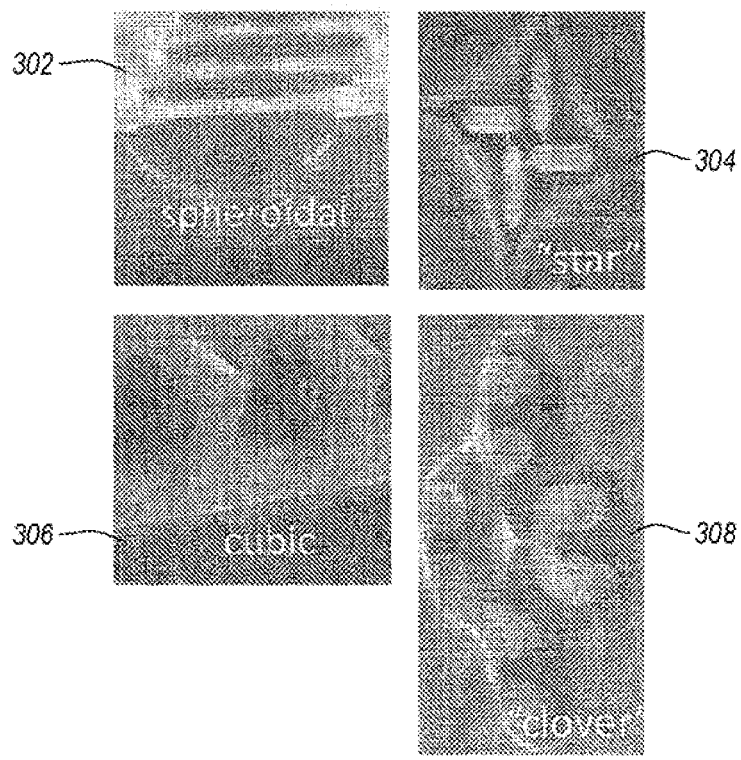
FIG. 3 illustrates examples of cavities that can be formed in a substrate of a small scale structure.

FIG. 3 illustrates examples of cavities that can be formed in a substrate of a metamaterial. FIG. 3 also illustrates that the unit-cells are formed in arrays of unit-cells. The cavities include, by way of example and not limitation, spheroidal cavities 302 (showing a row of an array), star shaped cavities 304, cubic cavities 306, and a clover shaped cavity 308. The cavities illustrated in FIG. 3 are by way of example only. The cavities can be formed with other shapes, including pyramidal and other geometric configurations. The formation of the cavities illustrated in FIG. 3 can be controlled by the number and/or shape of patterns in the membrane for each unit-cell, the placement of the patterns in the membrane, the type of material of which the substrate is formed, or the like or any combination thereof. For example, the clover cavity 308 may be formed by including four patterns for a given unit-cell. An isotropic etch causes four overlapping hemispherical cavities to be formed, which results in a clover shaped cavity.

Figure 4:
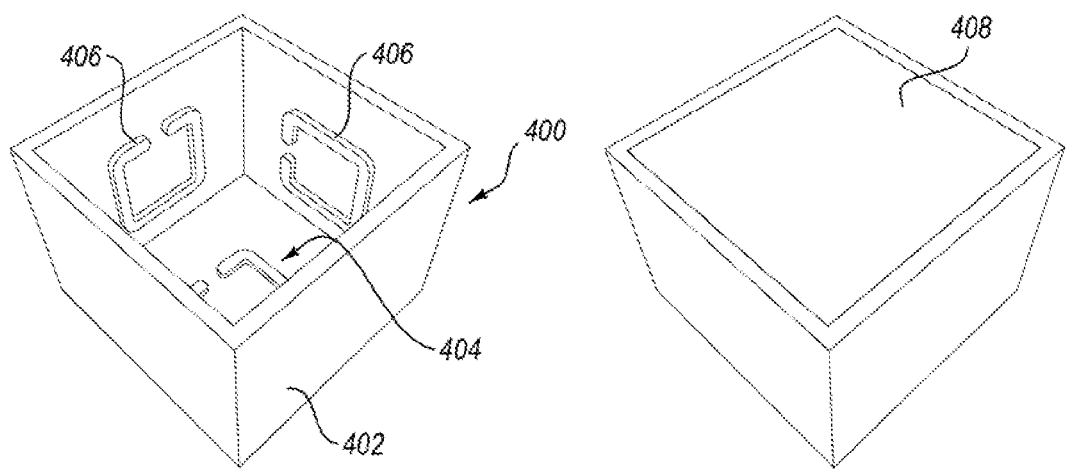
FIG. 4 illustrates the formation of a cubic cavity in a structure in accordance with at least some embodiments.

FIG. 4 illustrates the formation of a cubic cavity. During the formation of the cavities illustrated in FIG. 4, some of the steps discussed in FIG. 2 may be performed as necessary. The formation of a cubic cavity typically begins with a substrate 400. A matrix 402 is formed in the substrate 400 using, for example, a directional etch or an anisotropic etch to create a cubic cavity 404 or an array of cubic cavities in the substrate 400. Once the cavity 404 is formed, it may be backfilled with a sacrificial material 408. The sacrificial material 408 may have a higher rate of dissolution compared to the material of the matrix 402 or be formed of a material that is subject to dissolution in a solution that has no effect on the material of the substrate 402.

After the cavity 404 is backfilled with a sacrificial material 408, a membrane is then formed on the sacrificial material 408 and a pattern is etched or formed in the membrane. The sacrificial material 408 can then be removed as previously described to remove the sacrificial material 408. Once the cavity 404 is formed by dissolution of the sacrificial material 408, the pattern remains in the membrane and resonators 406 can be formed on the sides or walls of the remaining matrix 402 as previously described using MPL through the pattern in the membrane.

Figure 5:
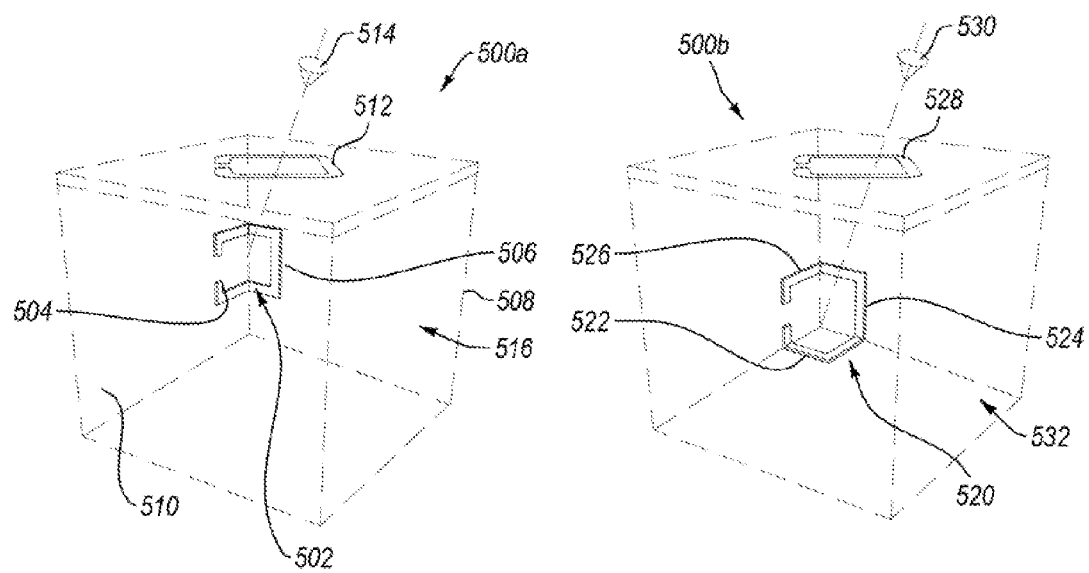
FIG. 5 illustrates examples of resonators that may be formed in a unit-cell of a structure by membrane projection lithography in accordance with at least some embodiments.

FIG. 5 illustrates examples of resonators that may be formed in a unit-cell 500a and 500b by MPL. FIG. 5 thus illustrates the formation of non-planar resonators in the unit-cell 500a and the unit-cell 500b. A resonator 502 is formed by directional evaporation 514 through a pattern 512 in the unit-cell 500a. The direction evaporation 514 is performed at an appropriate angle such that the resonator 502 is deposited on two different sides or walls of a cavity 516. A portion 504 of the resonator 502 is formed on a wall 510 (e.g., an x plane) and a portion 506 of the resonator 502 is formed on a wall 508 (e.g., a y plane) of the cavity 516. The resonator 502 is non-planar and can provide out of plane current characteristics.

In the unit-cell 500b, a directional evaporation 530 is angled with respect to a pattern 528 so that the resonator 520 is deposited or formed in at least three dimensions or planes. A portion 526 of the resonator 520 is in a first plane, a portion 524 of the resonator 520 is in a second plane, and a portion 522 of the resonator 520 is in a third plane of a cavity 532 of the unit-cell 500b.

If the pattern 512 is the same as the pattern 528, differently shaped resonators and differently configured unit-cells can be achieved by changing the angle of the evaporative deposition or changing the angle of the evaporative deposition relative to the unit-cells 500a and 500b. One of skill in the art can appreciate that the angle of directional evaporation and the shape of the cavity can be varied to achieve a wide variety of unit-cells or arrays of unit-cells and a wide variety of resonator configuration and/or placement within the unit-cell.

Figure 6:
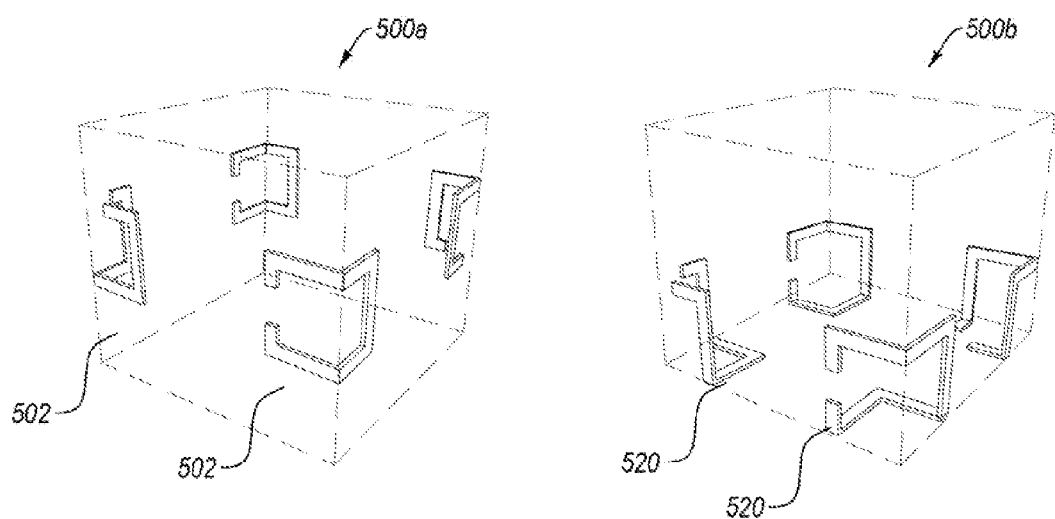
FIG. 6 illustrates examples of a unit-cell that includes resonators in multiple dimensions in accordance with at least some embodiments.

FIG. 6 illustrates examples of the unit-cells 500a and 500b after multiple evaporative depositions from different directions. The unit-cell 500a includes multiple instances of the resonator 502. Each instance of the resonator 502 exists in at least two planes. In one example, an array of the unit-cell 500a results in an array of multi-planar resonators (e.g., split-ring resonators (SSRs) in multiple planes). Similarly, the unit-cell 500b includes multiple resonators 520 in FIG. 6. An array of the unit-cell 500b results in an array of three dimensional resonators (e.g., SSRs).

As previously discussed, the unit-cells in an array of unit-cells can be formed simultaneously. A membrane can be formed over a suitable substrate or sacrificial material and patterns can be formed at each unit-cell location in the array. When the sacrificial material is removed or dissolved, the resonators can be formed in all of the cavities at the same time by directional evaporation. Adjacent unit-cells can be the same or different based on the lithography as discussed herein. For example, different patterns result in the deposition of differently shaped resonators. In addition, other aspects of adjacent unit-cells can also be controlled during fabrication. The cavities of adjacent cells, for example can be different. By way of example, structures can be fabricated that have repeating patterns on a unit-cell level, at an array level, or the like.

Figure 7:
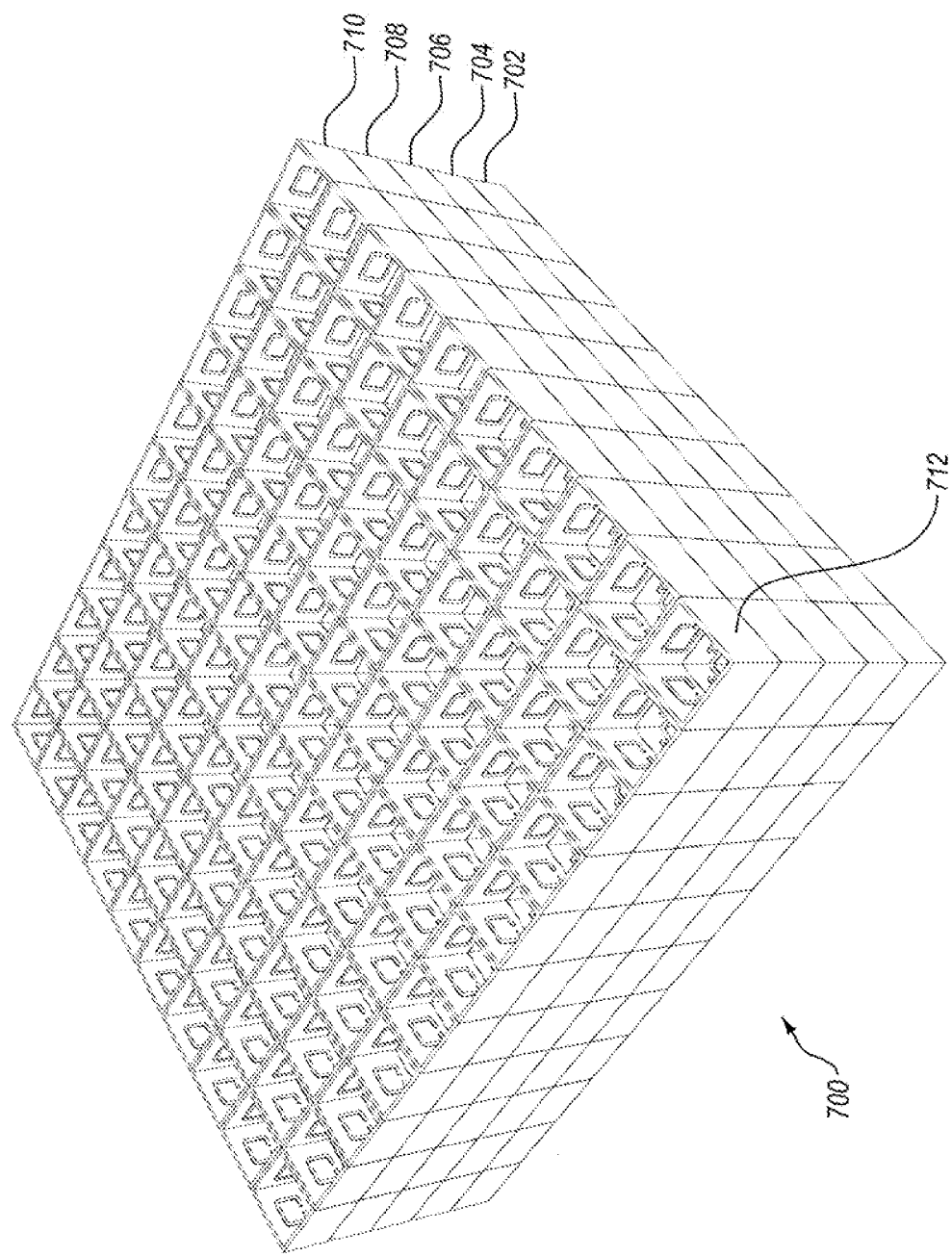
FIG. 7 illustrates a lattices structure that includes arrays of unit-cells in accordance with at least some embodiments.

FIG. 7 illustrates an example of a small-scale structure, which may be a metamaterial 700. The metamaterial 700 includes layers 702, 704, 706, 708, and 710. Each of the layers includes an array of unit-cells (e.g., the unit-cell 712). By stacking or forming the layers 702, 704, 706, 708, and 710 in succession, the metamaterial 700 can be formed. The layers 702, 704, 706, 708, and 710 may stacked in a manner that connects the layers together in a permanent manner.

In one example, the metamaterial 700 is fabricated by forming a first array or layer 702 of unit-cells as previously described. After the first array is formed, it may be backfilled by an appropriate material. The backfill material may be the same material as the substrate or a different material. The backfill material may be selected such that is does not impact the operation of the metamaterial 700. The backfill material and/substrates of each of the layers may be transparent to certain wavelengths or selected based on how the material affects the interaction of the unit-cells with electromagnetic waves.

After the first layer 702 is backfilled, another substrate (of the same or different material as the substrate in the layer 702) is formed on the layer 702 and an array of unit-cells is then fabricated in the new substrate to form the layer 704. In this manner, multiple layers of unit-cell arrays can be formed on top of each other. The last layer 710 may also be backfilled if desired.

Figure 8:
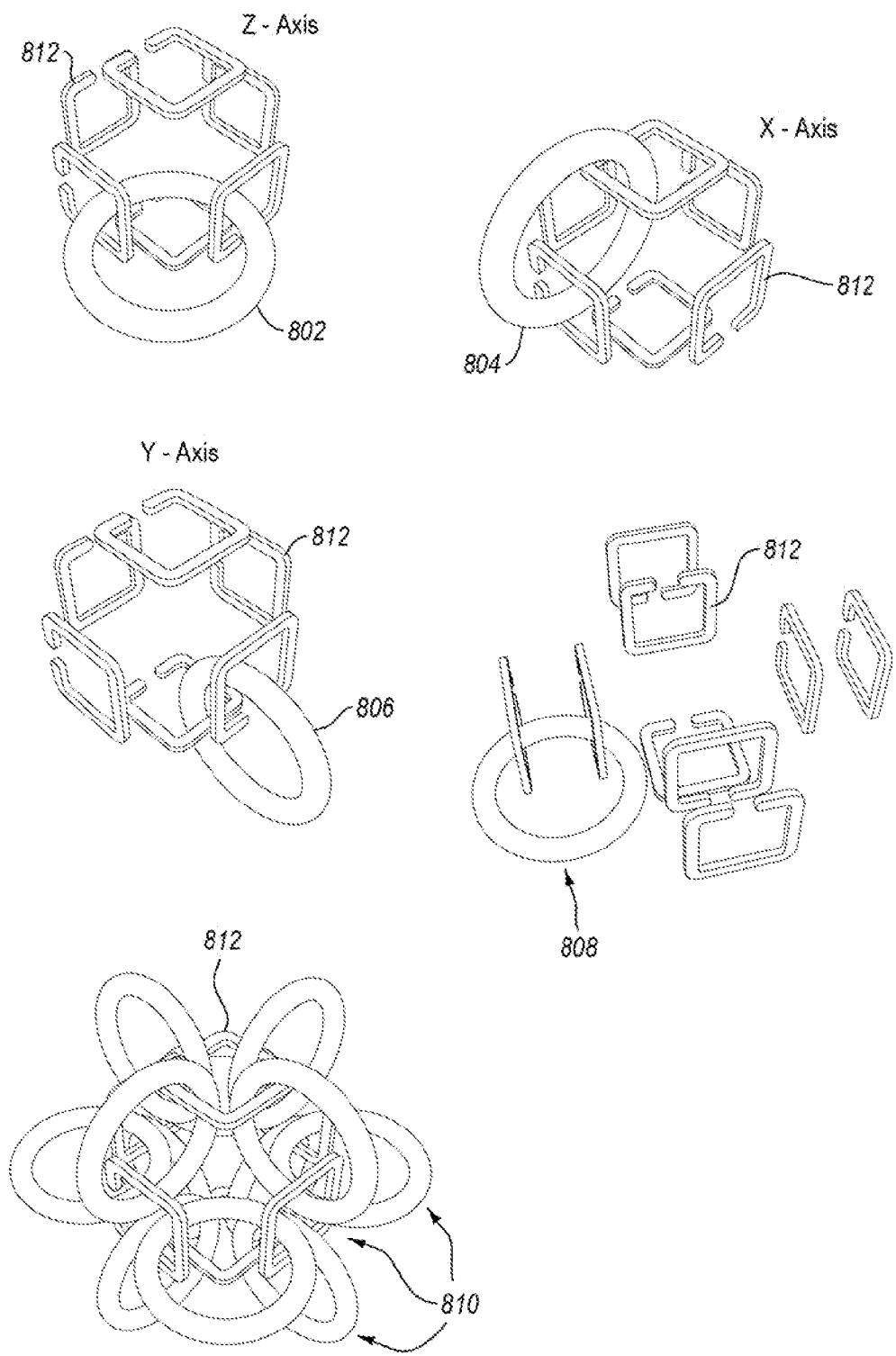
FIG. 8 illustrates examples of at least magnetic coupling between resonators of unit-cells in an array of unit-cells or in a lattice structure in accordance with at least some embodiments.

FIG. 8 illustrates an example of magnetic and/or electrical coupling between resonators in the same unit-cell and/or in different unit-cells. FIG. 8 illustrates resonators 812 that correspond to the resonators formed in the unit-cell 500*a* in FIG. 6. The resonators 812 can couple (e.g., magnetic flux) in a z-axis 802, an x-axis 804 and a y-axis 806. The resonators 812 can also couple with resonators in adjacent unit-cells, as illustrated by coupling with a nearest neighbor 808. Coupling 810 illustrates a plurality of ways in which the resonators 812 couple at least magnetically and electrically.

Figure 9:
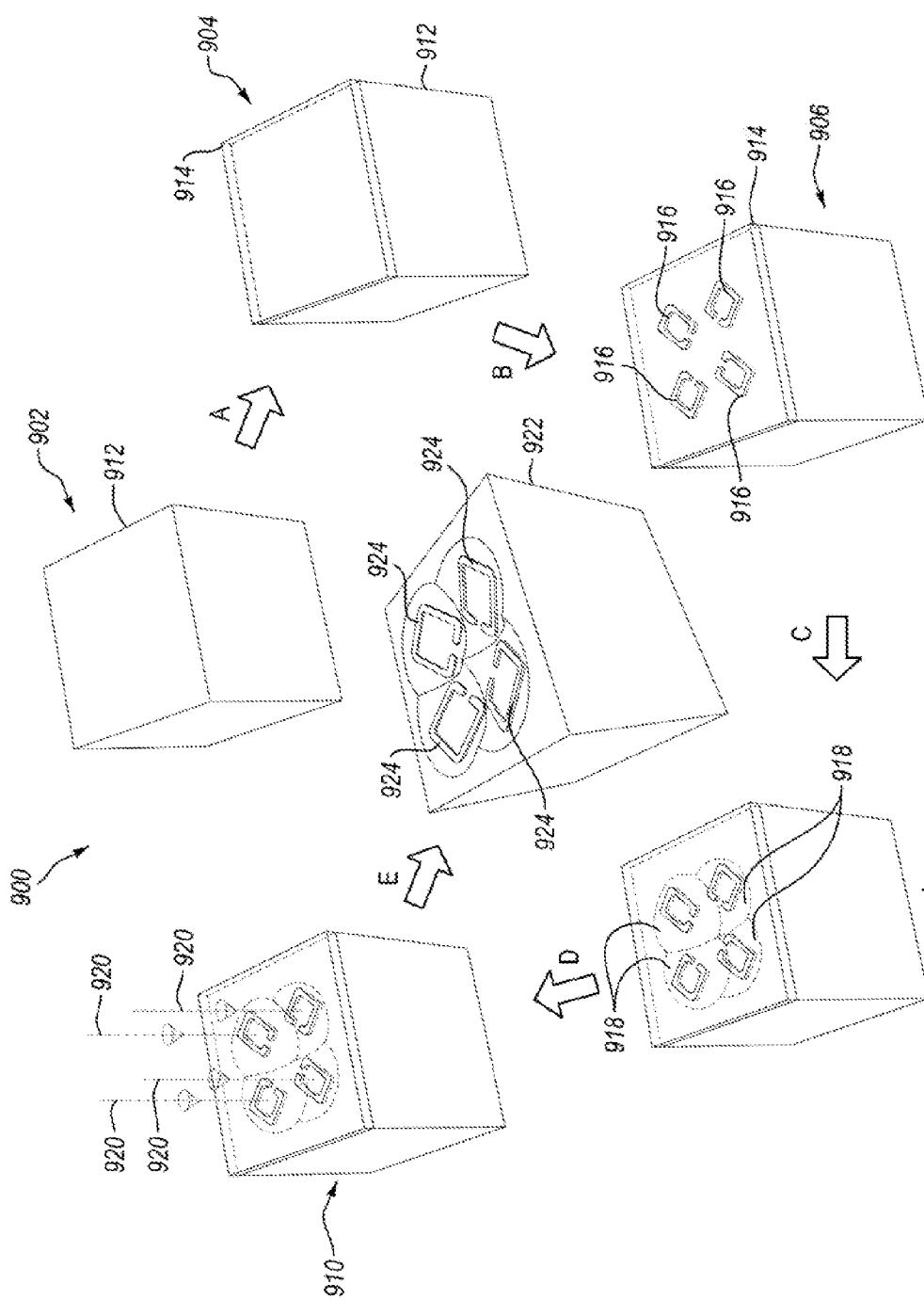
FIG. 9 illustrates the fabrication of multi-dimensional unit-cells using single direction membrane projection lithography in accordance with at least some embodiments.

FIG. 9 illustrates a method for fabricating a multidimensional metamaterial using a single evaporative deposition. FIG. 9 illustrates a unit-cell 922 of a 3D nano-antenna, a metamaterial or other structure. The unit-cell 922 can be formed to include multiple resonators in various orientations using a single evaporative deposition. In step 902, a substrate is obtained. In step 904, a membrane 914 is formed on the substrate 912. In step 906, multiple instances of a pattern 916 are formed in the membrane 914. Alternatively, a plurality of different patterns may be formed in the membrane 914 for each unit-cell or for different unit-cells. In other words, the patterns associated with a given unit-cell can have the same shape or different shapes. In addition, the patterns can have the same orientation or different orientations. FIG. 9 illustrates that the instances of the patterns 916 have the same shape but different orientations (all have their open portion towards the center).

In step 908, the substrate 912 is dissolved or removed, as previously described, underneath the patterns 916. In this instance, the cavity 918 is self aligned. When a spheroidal or hemispherical cavity is formed underneath the patterns 916, a plurality of patterns results in a cavity 918 that may have, for example, a clover shape. In step 910, evaporative deposition is to form resonators 924 on walls of the cavity 918. Because there are more than one pattern 916 in the membrane 914, all of the resonators 924 are deposited at substantially the same time. One of the resonators 924 is deposited through each pattern 916 and in each leaf of the clover shaped cavity 918.

In this example, the resonators 924 are split ring resonators and an opening of each of the resonators 924 is oriented towards a center of the cavity 918. The resonators can be oriented in other directions by forming the pattern as appropriate. In addition, the resonators 924 are formed on the wall of the cavity 918 and may be non-planar (depending on the shape of the cavity). By depositing the resonators 924 on a curved hemispherical or spherical surface, the resonators 924 are non planar and are all deposited in a single evaporation step in this example.

Figure 10:
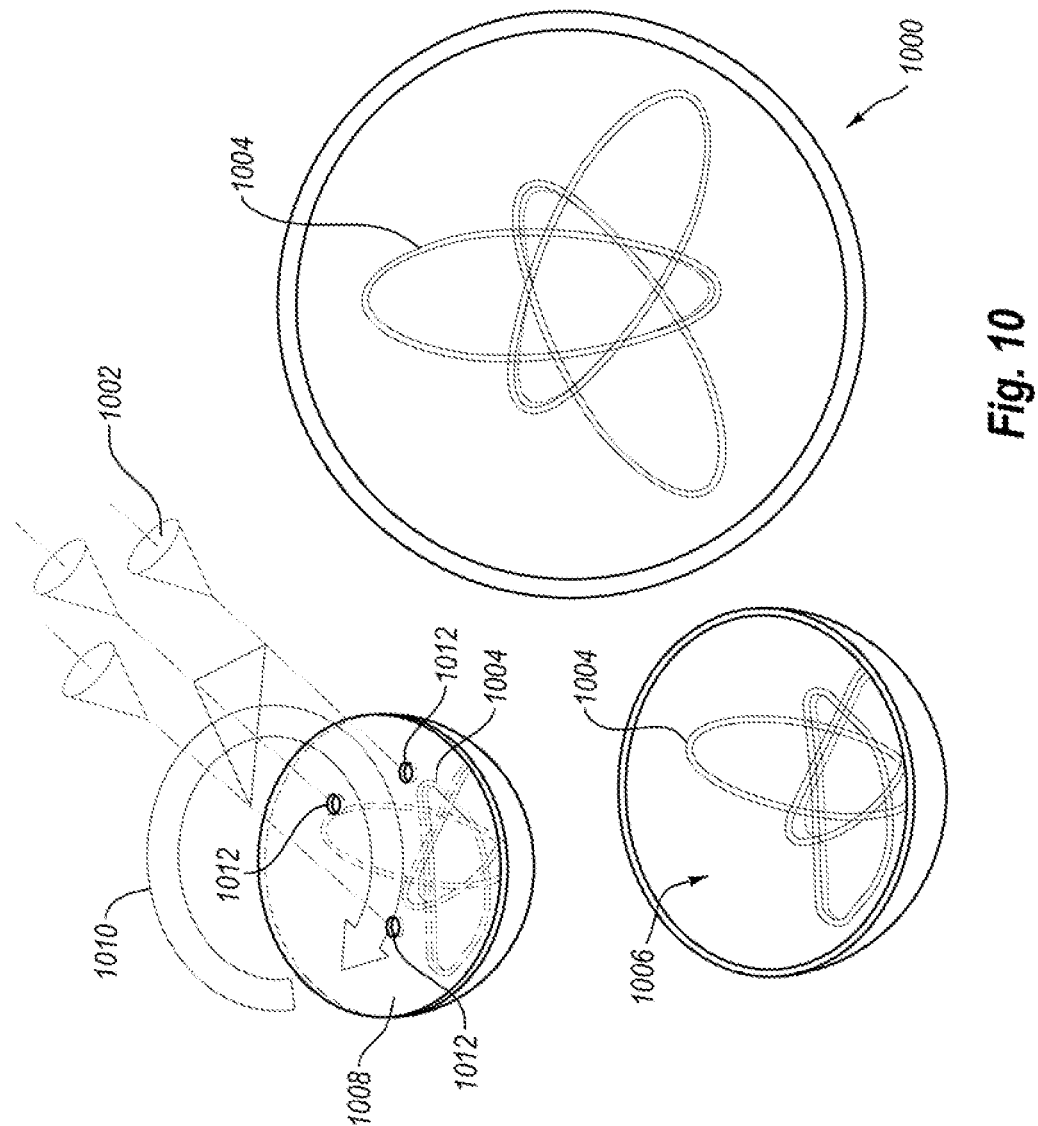
FIG. 10 illustrates the fabrication of a unit-cell, that includes closed resonators in accordance with at least some embodiments.

FIG. 10 illustrates another embodiment for forming a structure 1000, which may be a metamaterial, a 3D nano-antenna or other structure (e.g., microlens array, etc.). In this example, a membrane 1008 may have one or more patterns 1012 formed therein as previously described. In this example, the patterns 1012 are circular holes, although other configurations are within the scope of the invention. During evaporative deposition 1002 of a resonator material, the metamaterial 1000 may be rotated 1010 and/or tilted or angled relative to the evaporation deposition 1002. Rotation of the structure 1000 enables the material forming the resonator 1004 to be deposited on a wall of a cavity 1006 in a different manner than previously described. For example, the rotation of the structure 1000 relative to the evaporative deposition 1002 enables the formation of closed loop resonators. Also open loop resonators can also be formed, for example, by shuttering the evaporative deposition as appropriate. In addition, this manner of deposition may also result in overlapping resonators as illustrated by the resonators 1004. The shape of the resonators 1004 can be affected by changing an angle of the evaporative deposition, a location of the patterns 1012 in the membrane 1008, and/or the tilt or angle of the metamaterial 1000 relative to the evaporative deposition 1002, or the like or any combination thereof. In one example, the resonators 1004 can also be layered by using different materials in successive evaporative depositions.

Figure 11:
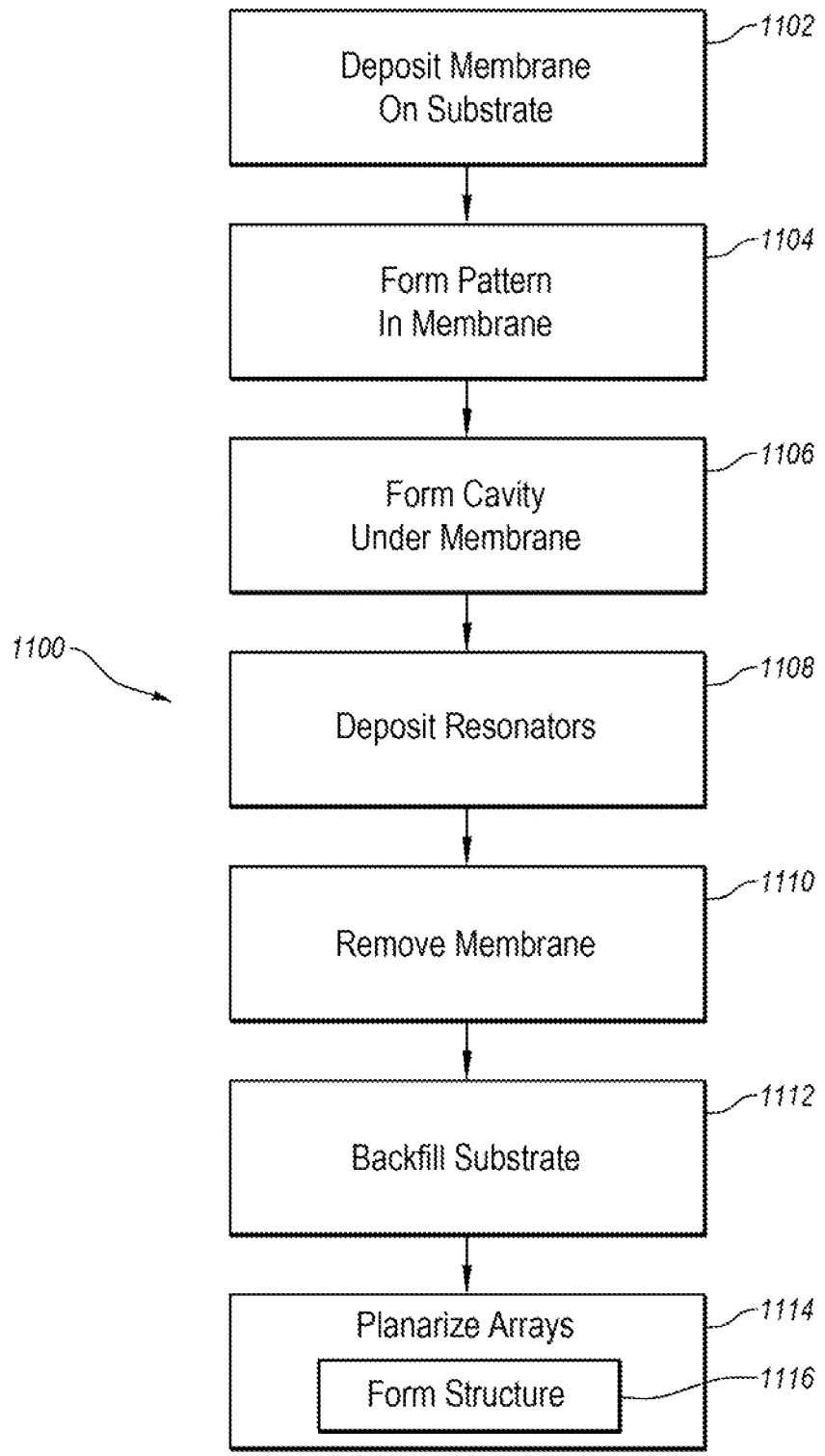
FIG. 11 illustrates an example of a method for fabricating three dimensional structures using membrane projection lithography in accordance with at least some embodiments.

FIG. 11 illustrates a method for forming a small-scale structure, such as a small scale metamaterial or a 3D nano-antenna in a substrate. The substrate may be composed of one or more materials. The substrate may include a sacrificial material that may be removed during fabrication. The substrate may also include multiple layers of the same or different materials. The substrate may be sized to accommodate multiple unit-cells of the structure arranged in an array of unit-cells. Multiple arrays can be fabricated and arranged to form a multi layered structure where each unit-cell and each layer has 3D engineered components.

The method 1100 may begin by depositing 1102 a membrane on a substrate. In some embodiments, as previously discussed, a backfilled matrix may be prepared prior to depositing the membrane. After depositing the membrane, a pattern may be formed 1104 in the membrane. The pattern may be formed, by way of example, using photoresist and conventional lithography techniques or other suitable methods. For each unit-cell, a single pattern or multiple patterns may be formed in the membrane. When multiple patterns are formed for a single unit-cell, the patterns may be the same in terms of shape and orientation or different in terms of shape and/or orientation.

After the patterns are formed in the substrate, a cavity is formed 1106 under the membrane in the substrate. Because the patterns are formed for each unit-cell in the substrate, the cavities may be self-aligned in one example. A cavity may be formed for each unit-cell in the array. During formation of the cavity, the sacrificial material or a portion of the underlying substrate is removed, for example by etching. As previously described, the cavity can be formed to have a particular shape. In one example, the sacrificial material is a polyimide which can be removed by basic aqueous photoresist developer while the membrane is formed by photoresist. This may occur during the lithography step of patterning the membrane since photoresist is used. Because the polyimide is also developable in the photoresist developer, after the photoresist pattern is created, the developer begins to dissolve the polyimide under the pattern.

In one example, the cavities are self-aligned due at least in part to the isotropic nature of the dissolution process occurring when forming the cavities in the substrate.

After forming the cavity for each of the unit-cells, the resonators in each unit-cell are deposited 1108. Directional evaporation is an example of a method for depositing the resonators. During directional evaporation and by way of example only, metal and/or dielectric material may deposited on the walls of the cavities formed in the substrate in one or more locations. During evaporative deposition, the substrate may be rotated and/or angled relative to the directional evaporative deposition.

The directional deposition of material can be performed a single time or multiple times in succession. In some examples, directional evaporation is performed multiple times from different locations or orientations. This enables instances of the resonators to be deposited on multiple locations within the cavity. In addition, each resonator may be substantially the same size and shape because all are formed through the same pattern for each unit-cell in some embodiments.

When forming instances of the resonator, there may be some distortion in the resulting resonators due to curvature, membrane thickness, and obliquity of evaporation. In addition, the size of the pattern may decrease as some of the material used to form the resonators is deposited on the membrane itself.

After deposition of the resonators, the membrane may be removed 1110. When forming a single array, the method may end at this point, subject to any post processing which may include backfilling, array dicing, or the like. When constructing a multi-layer structure, the unit-cells may then be backfilled 1112 in preparation for forming a multi-layered structure. The array is then planarized 1114. And additional layers are formed 1116 to form the multi-layer structure. The additional layers may be formed in a manner similar to the initial layer. The unit-cells structures can vary within an array as well as between layers. For example, one layer in a multi-layer structure may have a first resonator shape while a second layer may include a second resonator shape.

FIGS. 12-15 further illustrate dynamic membrane projection lithography for creating structures with closed loop resonators and/or open loop resonators. FIGS. 12-15 further illustrate rotational MPL where the resonators are evaporatively deposited during rotation of the substrate relative to the evaporative deposition. As previously described, embodiments of the structures disclosed herein include non-planar resonators that can be configured as nano-antennas. As discussed in more detail below, the resonators can be arranged in multiple configurations, shapes and/or orientations. The resonators can be multi-planar, open looped, closed looped, overlapping, symmetrical, asymmetrical or the like or any combination thereof. In addition, some embodiments may also include planar resonators in various orientations as discussed herein.

Non-planar resonators may have electromagnetic behavior that can be modeled as the superposition of current loops which respond to incident magnetic fields and charge-separating dipole elements which respond to incident electric fields. The precise behavior depends on the physical parameters (size, linewidths, orientation, symmetry, etc.). The size of the structures can operate with infrared and optical wavelengths.

Figure 12:
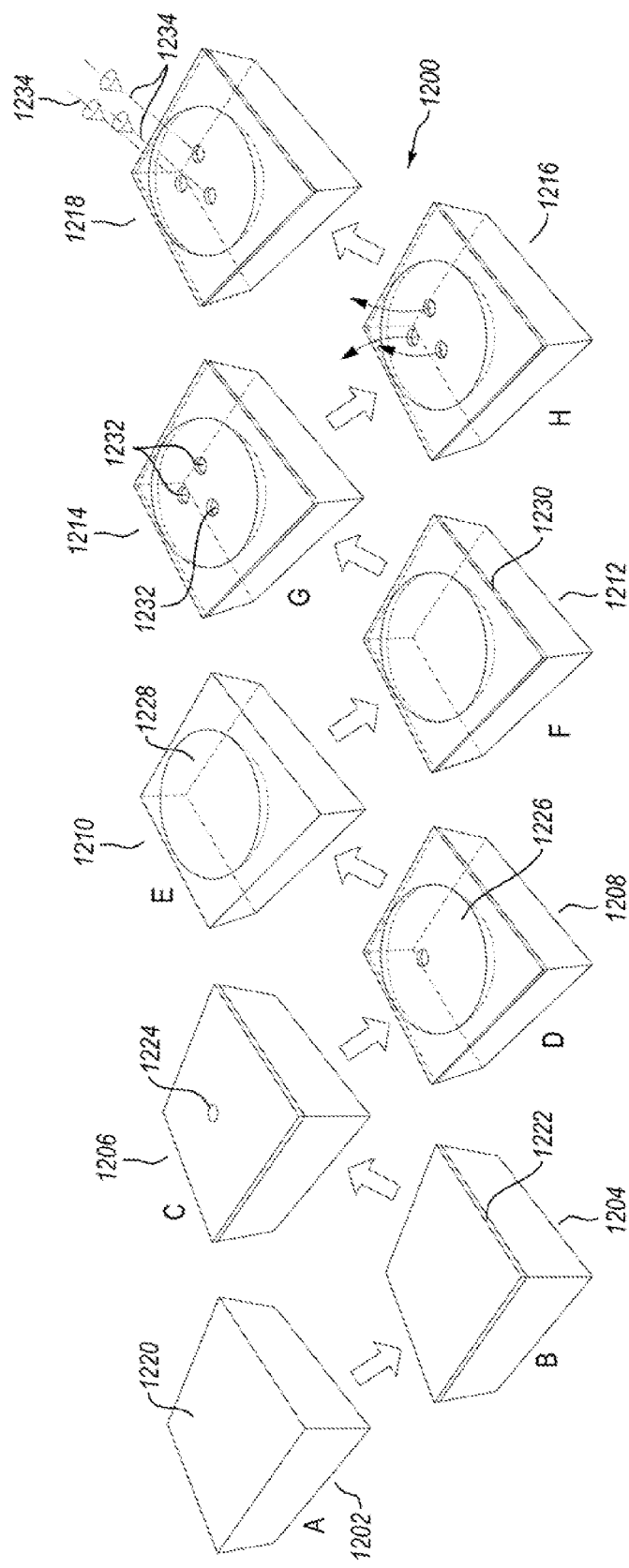
FIG. 12 illustrates a series of images that depict a process of fabricating a small-scale structure.

FIG. 12 illustrates a series of images that depict a process of fabricating a small-scale structure such as a 3D nano-antenna. FIG. 12 is illustrated in the context of a single unit-cell and one of skill in the art can appreciate, with the benefit of the present disclosure, that unit-cells can be fabricated in arrays of unit-cells as previously described. The process illustrated in FIG. 12 begins at 1202 with a substrate 1220, which is an example of other substrates discussed herein. At 1204, a membrane 1222 is deposited on the substrate 1220. The membrane 1222 may act as a barrier material that is resistant to a dissolution etch of the substrate or the like and is yet still subject to its own dissolution mechanism.

For example, the membrane 1222 may be deposited with an isotropic dissolution etch (e.g., $XeF_2$ for silicon, hydrofluoric acid for silicon oxide). The membrane 1222 may be resistant to the etch chemistry associated with the substrate 1220 yet still be subject to dissolution. A suitable membrane 1222 may include photoresist, PMMA, oxide, nitride, metallic films or the like.

At 1206, the membrane 1222 is patterned with at least one hole 1224. The hole 1222 may be circular, elliptical, or have another shape or configuration. At 1208, the substrate 1220 is etched through the hole 1224. In this case, the membrane 1222 is resistant to the substrate etch chemistry. As a result, a cavity 1226 may be formed under the membrane 1222. When an isotropic etch is used, the cavity 1226 may be hemispherical in shape.

At 1210, the membrane 1222 is removed using appropriate membrane chemistry and the cavity 1226 is backfilled with a sacrificial material and planarized. At 1212, a second membrane 1230 (which may be the same as or different from the membrane 1222) is deposited on the substrate 1220 and the sacrificial material.

At 1214, a pattern 1232, which may include one or more holes, is formed in the membrane 1230. The pattern 1232 may be different from the pattern 1224. More specifically, the pattern 1224 is formed in order to form the cavity 1226. The pattern 1232, in contrast, is typically formed for the deposition of resonators inside the cavity 1226. The pattern 1232, like the pattern 1224, may be circular holes, lines, or the like.

At 1216, the sacrificial material is removed, for example by dissolution. At 1216, the sacrificial material is removed or subject to the etch chemistry. As a result, the shape of the cavity is substantially unaffected by removal of the sacrificial material. The membrane 1230 is substantially unaffected by the removal of the sacrificial material in the cavity 1226. In other words, removable of the sacrificial material does not prevent the pattern 1232 from effectively being used during evaporative deposition. In this manner, the membrane 1230 remains intact over the cavity 1226 after removal of the sacrificial material.

At 1218, resonators are deposited on the walls of the cavity 1226 through the patterns 1232. The resonators may be formed by directional evaporation. During the directional evaporation at 1234, the structure being fabricated can be angled and/or rotated relative to the directional evaporation 1234. The source of the directional evaporation can also be angled and or rotated relative to the substrate 1220. By rotating and/or angling the source of the evaporation and/or or the structure, a wide variety of resonators can be formed on the walls of the cavity.

The fabrication of a structure as discussed herein can occur using a single membrane or using multiple membranes. A single membrane is effective for self alignment of the cavities as previously discussed. A dual membrane approach, such as illustrated in FIG. 12, can accommodate more general patterns and may offer more control over the cavity and/or shape of the resonators deposited by rotational deposition.

Figure 13:
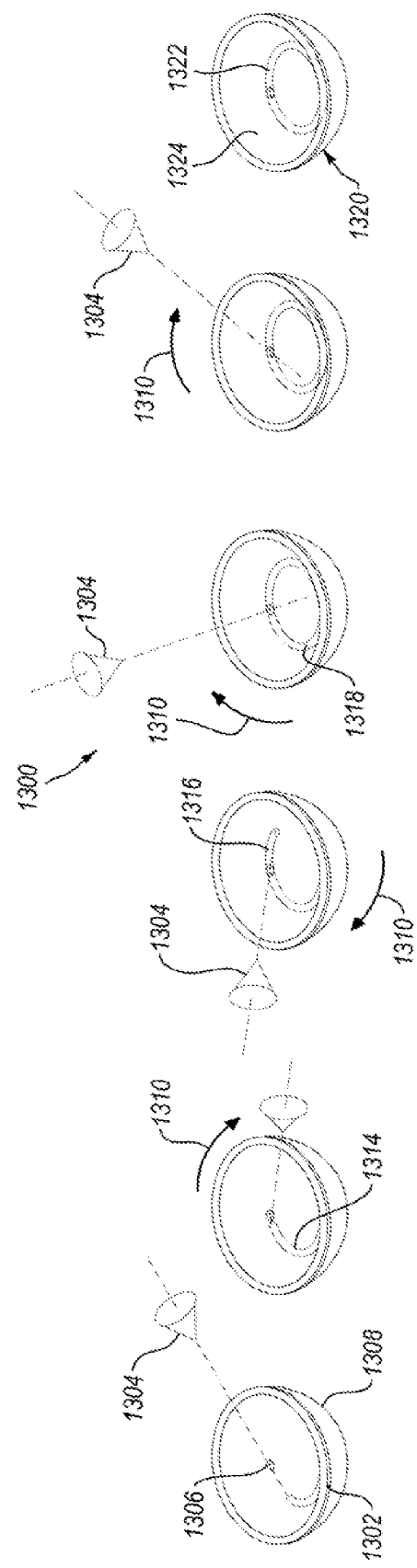
FIG. 13 illustrates a small scale structure that is rotated during fabrication to form closed-loop resonators.

FIG. 13 illustrates the formation of a structure and illustrates a small-scale structure that is rotated during fabrication to form closed-loop resonators. FIG. 13 also illustrates a single unit-cell, although the fabrication extends to an array of unit-cells. At 1302, a directional evaporation 1304 begins through a pattern 1306. The directional evaporation 1304 deposits a resonator of suitable material on a wall of the cavity 1308. Rotation 1310 of the cavity 1308 relative to the directional evaporation 1304 begins depositing the resonator 1314 according to a path, which path usually determined in advance by setting a tilt angle of the structure 1320 relative to the evaporative deposition 1304. The rotation 1310 in the method 1300 shows that the resonator begins to form, as shown by resonator portions 1314, 1316, and 1318. During rotation, the resonator is formed according to the path. Full rotation can result in a closed loop resonator, such as the completed closed-loop resonator 1322. Thus, after the membrane is removed, the completed resonator 1322 remains on the a wall 1324 of the cavity 1308 of the structure 1320.

In this example, the resonator 1322 is a closed loop resonator formed in a substantially circular shape. If desired, the angle and/or position of the directional evaporation 1304 relative to the structure 1320 can be changed and another resonator may be deposited on the wall 1324 of the cavity 1308.

Figure 14:
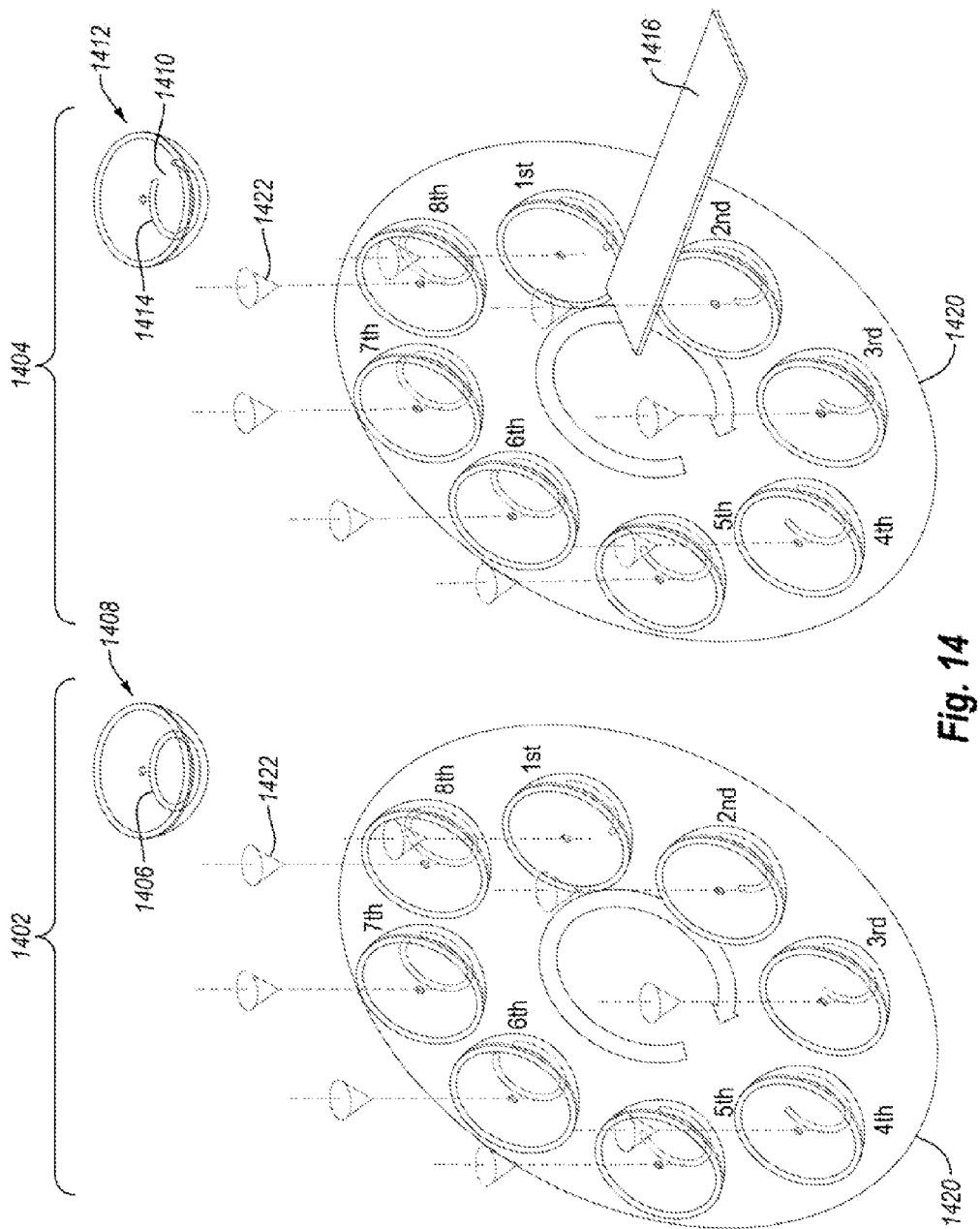
FIG. 14 illustrates an example of fabricating a small scale structure using rotational evaporative deposition.

FIG. 14 illustrates an example of fabricating a small scale structure using rotational evaporative deposition. FIG. 14 further illustrates small scale structures that are rotated during fabrication and that include closed-loop structures and/or open loop structures. FIG. 14 illustrates an example 1402 of evaporative deposition 1402 that forms a closed loop resonator 1406 and an example 1404 of evaporative deposition that forms an open loop resonator 1414.

As illustrated in the example 1402, a structure 1408 (e.g., a unit-cell or more generally a substrate that includes an array of unit-cells) is mounted on a turntable 1420. The turntable 1420 may be angled or tilted. An evaporative source 1422 is used to deposit the resonator 1406 by evaporative deposition. In this example, the evaporative source 1422 may be held stationary while the turntable 1420 rotates at a predetermined speed. The evaporative deposition may be accomplished in a single rotation or in multiple rotations of the turntable 1420. As the turntable 1420 rotates, the evaporative source 142 deposits material that forms the resonator 1406 according to a predetermined path. The evaporative source 1422 and the turntable 1420 are configured to deposit the material in the cavity of the structure 1308 such that the resonator 1406 has a predetermined shape. In one example, the position of the pattern in the membrane may have an impact on the position of the resonator within the cavity.

The example 1404 is similar to the example 1402. In the example 1404, however, a shutter 1416 is included. As the turntable 1420 rotates, the shutter 1416 is positioned such that the evaporative source 1422 is blocked. The shutter 1416, for example, may be actuated to block the evaporative deposition and then withdrawn according to predetermined times. The timing of the shutter 1416 can influence the orientation of the opening in the open-loop structure. As a result, for a portion of the rotation of the turntable 1420, material is not deposited on the wall of the cavity in the structure 1412. The shutter 1416 can thus be used to form an open loop resonator 1414 in the cavity 1410 of the structure 1412. One or more shutters may be used to form multiple openings in the resonator 1414. In another example, the rotation of the turntable 1420 may also be varied or halted during deposition. This may result in resonators that have a varying thickness.

Figure 15:
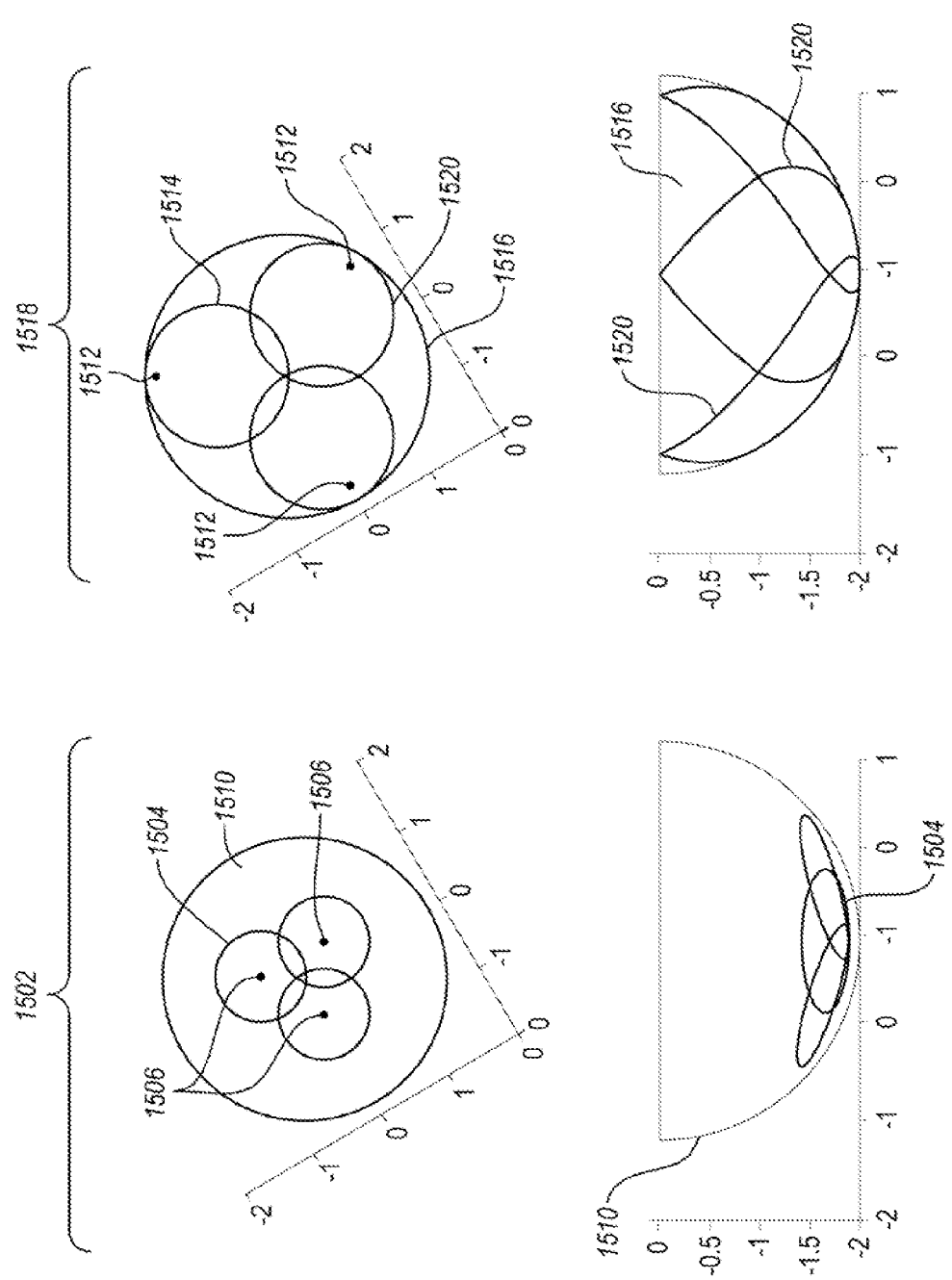
FIG. 15 illustrates examples of resonator configurations formed using rotational membrane projection lithography.

FIG. 15 illustrates an example of the variability in resonator deposition in accordance with at least some of the embodiments disclosed herein. FIG. 15 illustrates an example of a structure 1502 and an example of a structure 1518. During fabrication of the structure 1502, patterns 1506 are formed relatively close to a center of the cavity 1510. With a low angle (e.g., about 20 degrees from normal to the surface of the membrane) of incidence for the deposition source, rotation of the structure 1502 results in resonators 1504 that are deposited on the wall of the cavity 1510. Because of the low angle and the closeness of the patterns 1506 to the center of the cavity, the resonators 1504 are deposited substantially on a bottom of the cavity 1510 and may be approximated by a planar model even though the resonators 1504 may have some non-planar characteristics.

In the structure 1518, however, the pattern 1512 is formed more near an edge of the cavity in the membrane. The pattern 1512 may have symmetry or not. With an increase in the tilt angle and/or the angle of incidence of the evaporative source, the resonators 1520 formed in the structure 1518 occupy much of the surface area of the cavity 1516 and are full 3D resonators with significant non-planar current flow.

Embodiments of the structures disclosed herein can be configured an 3D antennas. The antennas can be made on a small scale. By way of example and not limitation, a cavity may have a radius of around 2 micrometers and unit-cells can be centered on an 8 micrometer grid in an array of unit-cells. One of skill in the art can appreciate, with the benefit of the present disclosure, that the fabrication can include micrometer and smaller scale structures.

The size of the structures disclosed herein enable the structures to be used as antennas for different wavelengths of signals. For example, a 3D nano-antenna could be energized by an optical signal (e.g., infrared). As a result, an array of unit-cells or even a single unit-cell could be configured to convert an optical signal to an electrical signal and be used in photonic applications.

Embodiments can produce complicated resonator arrangements, including open and/or closed loop structures. As a result, the resonators can be excited with both electric and/or magnetic fields.

Embodiments can be used to form sensors that are able to detect wavelengths that may be emitted by a chemical or composition or that can detect the electromagnetic signature of a substance. Spectroscopy applications can also incorporate 3D nano-antenna structures to detect certain wavelengths or ranges of wavelengths. An array of unit-cells may be configured for steering applications and focused antenna array applications. An array of 3D-nano-antennas, may also be able to identify a location of a substance by providing informational information. Embodiments enable small-scale structures to be incorporated into integrated circuits, which may enable on-chip optical communication by combining light emitted structures (e.g., light emitting diodes, vertical cavity surface emitting lasers, edge emitting lasers) with antenna structures that can be energized by these wavelengths.

In addition to the examples disclosed herein, various semiconductor techniques may be used to form the cavities. For example, the matrix of a substrate having cubic cavities may be grown as opposed to etched from a thicker substrate.

Various materials may be used in the fabrication of the structures disclosed herein. By way of example and not limitation, the membrane may be photoresist, polymethyl methacrylate (PMMA), silicon oxide or silicon nitride, aluminum nitride, and titanium nitride. The substrate may include SU-8, a developable polyimide, silicon, other semiconductor materials, and oxide or the like. For example, the membrane may comprise a silicon oxide layer grown on a single crystal silicon substrate. The traces or resonators may be, by way of example only and not limitation, on the order of micrometers and may have a thickness in the range of nanometers. For antenna applications, frequently the length of the antenna is half the operational effective wavelength. Many molecules have vibrational modes in the 3-10 micrometer range, so that traces of 1.5-5 micrometers can form half-wave antennas. In addition, thermal radiation at 300K (room temperature) forms a blackbody Planck spectral distribution with its peak located around 10 micrometers, so that antennas/emitters designed to manipulate thermal emission from surfaces would employ traces with effective length of 5 micrometers. For objects hotter than 300K, the Planck distribution shifts to shorter wavelength, and hence half-wave antennas shorter than 5 micrometers are needed. The effective length of the antenna is a function of several variables, including the surrounding medium. For instance a linear half-wave dipole antenna which operates at 10 micrometers when surrounded in air (index of refraction=1) needs to be approximately 5 micrometers. The same antenna, when surrounded by a high dielectric medium (for instance silicon, index of refraction ~3.4) would be ~1.5 micrometers in length. The transverse dimensions of the antenna can also be reduced by bending the dipole into a shape other than a straight line. For instance a linear dipole antenna of 3.14 micrometers can be bent into an unclosed circle of diameter 1 micrometer. The unit-cells may be configured to be large enough to accommodate the entire transverse dimensions of the resonators, antennas, emitters, or other deposited contents of the unit unit-cell. The traces or resonators may be formed from a number of different materials, such as metal or alloys (e.g., titanium, gold, silver, copper, alloys thereof, or combinations thereof).

The following working example provides further detail in connection with the specific embodiments described above.

In this example, an SU8-2000.5 (MicroChem, Newton, Mass.) sample is deposited on a double polished Si wafer, spun at 3000 rpm for 30 s and soft baked at 90° C. for 3 min on a hot plate. The sample is flood exposed for 30 s with a 60 s, 90° C. post-exposure bake (PEB). This 500 nm thick layer acts as an adhesion layer for the thicker boxes. SU8-2005 (higher viscosity than SU8-2000.5) is deposited, spun at 3000 RPM and soft baked at 65° C. for 1 min and then 90° C. for 3 min, yielding a 5 micrometer thick film. The sample is exposed on a contact mask aligner for 8 s followed by a 20 s 90° C. PEB. The samples are developed for 40 s in propylene glycol methyl ether acetate (PGMEA) to create the array of 5 micrometer tall SU8 boxes (e.g., cubic cavities). A developable polyimide coating (Pro-LiFT 100, Brewer Science, Rolla Mo.) is then deposited over the exposed boxes, spun at 2000 RPM and soft baked for 1 min at 90° C. and then 150° C. for 4 min. The sample is then immersed in trimethyl ammonium hydroxide (TMAH) based positive resist developer (AZ400K, AZ Electronic Materials, Charlotte N.C.) diluted 1:4 with water for ~15 s to expose the tops of the SU8 boxes. Poly methylmethacrylate (PMMA) is spin coated and soft baked at 170° C. for 30 min. The membrane pattern is exposed using a JEOL JBX-9300FS e-beam system and developed for 70 s in 1:3::MIBK:IPA, (methyl isobutyl ketone:isopropyl alcohol) rinsed in IPA and dried. The samples are immersed in AZ400K 1:4 for 2 min to completely dissolve out the polyimide, leaving a PMMA membrane with the SRR pattern suspended over the cavity surrounded by the SU8 walls. E-beam evaporation is used to deposit a Ti/Au metal stack of 100 Å/500 Å at ~5×10$^{-7}$ Torr at a rate of 5 Å/s. An angled fixture was placed in the evaporator so that the evaporation occurs at an angle of 45 degrees with respect to the sample surface normal. Four consecutive evaporations are performed with the sample rotated 90 degrees between each successive evaporation resulting in deposition of the SRR pattern on the inner face of each wall. The angled fixture was removed and a final, normally oriented evaporation deposited the final SRR pattern on the floor of the cavity. Acetone spray was used to lift-off the metal-coated PMMA membrane yielding the final structure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A small-scale structure, comprising:
   a substrate;
   a cavity formed in the substrate, the cavity having a wall and having a radius in a range between one micrometer and ten micrometers; and
   at least one closed-loop electromagnetic resonator formed conformally on a non-planar portion of the cavity wall, wherein the at least one resonator comprises material deposited as a closed curve on the cavity wall, wherein the at least one closed-loop resonator is deposited by membrane projection lithography, and wherein the substrate is rotated during deposition to form the at least one closed-loop resonator.

2. The small-scale structure of claim 1, wherein the at least one resonator is configured as an antenna for optical wavelengths or for chemical signature wavelengths.

3. The small-scale structure of claim 1, wherein the at least one resonator is configured to be excited by magnetic fields, electric fields, or both.

4. The small-scale structure of claim 1, wherein the at least one resonator comprises overlapping resonators or non-overlapping resonators.

5. A small-scale structure, comprising:
   a substrate;
   a cavity formed in the substrate, the cavity having a wall and having a radius in a range between one micrometer and ten micrometers; and
   at least one closed-loop electromagnetic resonator formed conformally on a non-planar portion of the cavity wall, wherein the at least one resonator comprises material deposited as a closed curve on the cavity wall,
   wherein the at least one resonator is configured to provide the small-scale structure with a negative index of refraction.

* * * * *